United States Patent
Pleasant et al.

(10) Patent No.: US 7,640,477 B2
(45) Date of Patent: Dec. 29, 2009

(54) CALIBRATION SYSTEM THAT CAN BE UTILIZED WITH A PLURALITY OF TEST SYSTEM TOPOLOGIES

(75) Inventors: Daniel L. Pleasant, Santa Rosa, CA (US); Christopher E. Stewart, Sebastopol, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 338 days.

(21) Appl. No.: 11/127,961

(22) Filed: May 12, 2005

(65) Prior Publication Data

US 2006/0282723 A1 Dec. 14, 2006

(51) Int. Cl.
G06F 11/00 (2006.01)
G01R 31/28 (2006.01)

(52) U.S. Cl. ...................... 714/741; 714/724

(58) Field of Classification Search .......... 714/727, 714/724, 741
See application file for complete search history.

(56) References Cited

U.S. PATENT DOCUMENTS 5,757,820 A * 5/1998 Angelotti ............... 714/738
6,952,816 B2 * 10/2005 Gupta et al. .............. 716/18
2004/0076139 A1 4/2004 Kang-Yeh et al.

FOREIGN PATENT DOCUMENTS

JP 2004319828 A * 11/2004

OTHER PUBLICATIONS

Huang, Wu, Liu, Tsai, Wang, Chiueh, Boundary Scan for 5-GHz RF Pins Using LC Isolation Networks 2004, IEEE, $22^{nd}$ IEEE VLSI Test Symposium.*
GB Search Report Under Section 17 dated Aug. 30, 2006.
Jim Fitzpatrick, Hewlett-Packard Company, Santa Rosa, California—"Error Models For Systems Measurement", Microwave Journal, May 1978, pp. 63-66.

* cited by examiner

*Primary Examiner*—Cynthia Britt

(57) ABSTRACT

A calibration system within a test system is disclosed. The calibration system may include a netlist, a path correction module, and a processor in signal communication with the path correction module. The netlist may include a list of electrical characteristics of components in the test system and a topology of the test system. The calibration system can be used with a variety of test system topologies.

13 Claims, 4 Drawing Sheets

CALIBRATION SYSTEM THAT CAN BE UTILIZED WITH A PLURALITY OF TEST SYSTEM TOPOLOGIES

BACKGROUND OF THE INVENTION

Frequently, several types of test instruments are connected together to create a test system for verifying the functions of an electrical device. Each instrument employed in a test system is typically connected with other test instruments and a device under test (DUT) by cables and switches. Each test instrument, cable and switch in the test system has a unique signal path that may affect the operation and measurements obtained by the test system. Furthermore, test systems often employ signal conditioning hardware, e.g. amplifiers and signal splitters that further impact the test system results.

In general, test instruments in test systems may be calibrated with respect to what the test instrument measures; however, the signal connections in the test instrument will always have some effect on the measurement being made. To obtain the most accurate measurements it is typically necessary to calibrate the test system as a whole rather than each individual test instrument. To calibrate the test system as a whole, the measuring effects of each element in the signal path should be determined and subtracted from the raw measurement data. For instance, a cable may be used to connect the test system to the DUT. If that cable has a signal loss of 1 dB, it will affect the measurement data by 1 dB. If the loss of the cable is known in advance, then 1 dB may be added to the measured data to correct for the cable loss.

Prior attempts at test system calibration typically depend on the topology of the test system, and rely on a fixed signal path. In that case, equations may be written that compensate for each element in the signal path. The individual elements may be characterized in some way, and a fixed set of equations may be utilized to obtain corrected measurement results.

The problem with this approach is that when a test system includes multiple switch paths, or when parts of the signal path change from time to time, or when the overall system topology cannot be determined in advance the characterization of the test system is impractical if not impossible. It is not possible to generate a set of equations to correct the measurements of a test system whose topology is unknown; and if the test system topology is changed, the equations must be reformulated and test software rewritten to compensate for these changes.

Therefore, there is a need for an approach to calibrate a test system as a whole that overcomes the problems and limitations explained above.

SUMMARY

A topology-independent calibration system ("TICS") within a test system is disclosed. The TICS may include a netlist, a path correction module, and a processor in signal communication with the path correction module. The netlist may include a list of electrical characteristics of components in the test system and a topology of the test system. Additionally, the processor may utilize the path correction module and the netlist to determine path corrections for the test system.

As an example of operation, the TICS may perform a process that determines the path errors in a test system. The process may include executing a path correction module by a processor, accessing a netlist containing electrical characteristics of components of the test system and a topology of the test system, and determining a path correction for the test system.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

An approach for calibrating a test system by using linear network parameter simulation, such as S-parameters to correct for measurement errors in the test systems is described. The S-parameter simulator may de-embed circuit components, such as transmission lines, switches and amplifiers, which is mathematically the same thing as correcting for their effects, is independent of test system topology, and may be employed at run-time. Thus, by using S-parameter simulation, more accurate measurements of a DUT are achieved without changing equations.

Generally, test systems, may be made up of modular or synthetic test components, test instrument systems, "all in one box" test instruments, or a combination of synthetic instrument systems and "all in one box" test instruments herein referred to generally as "test components." Often, test systems may have a number of test components, such as signal generators, oscilloscopes, and analyzers. Each test component and associated signal paths and switches introduce power losses or gains, phase delay, time delay, or other undesired changes to a test signal to and from a device under test ("DUT") within a test system. To adjust the measurement data so as to compensate for the errors introduced by the signal path, each test component along with the associated signal paths and switches needs to be characterized. The adjustment is preformed by a topology-independent calibration system ("TICS") utilizing linear network parameter simulation.

Figure 1:
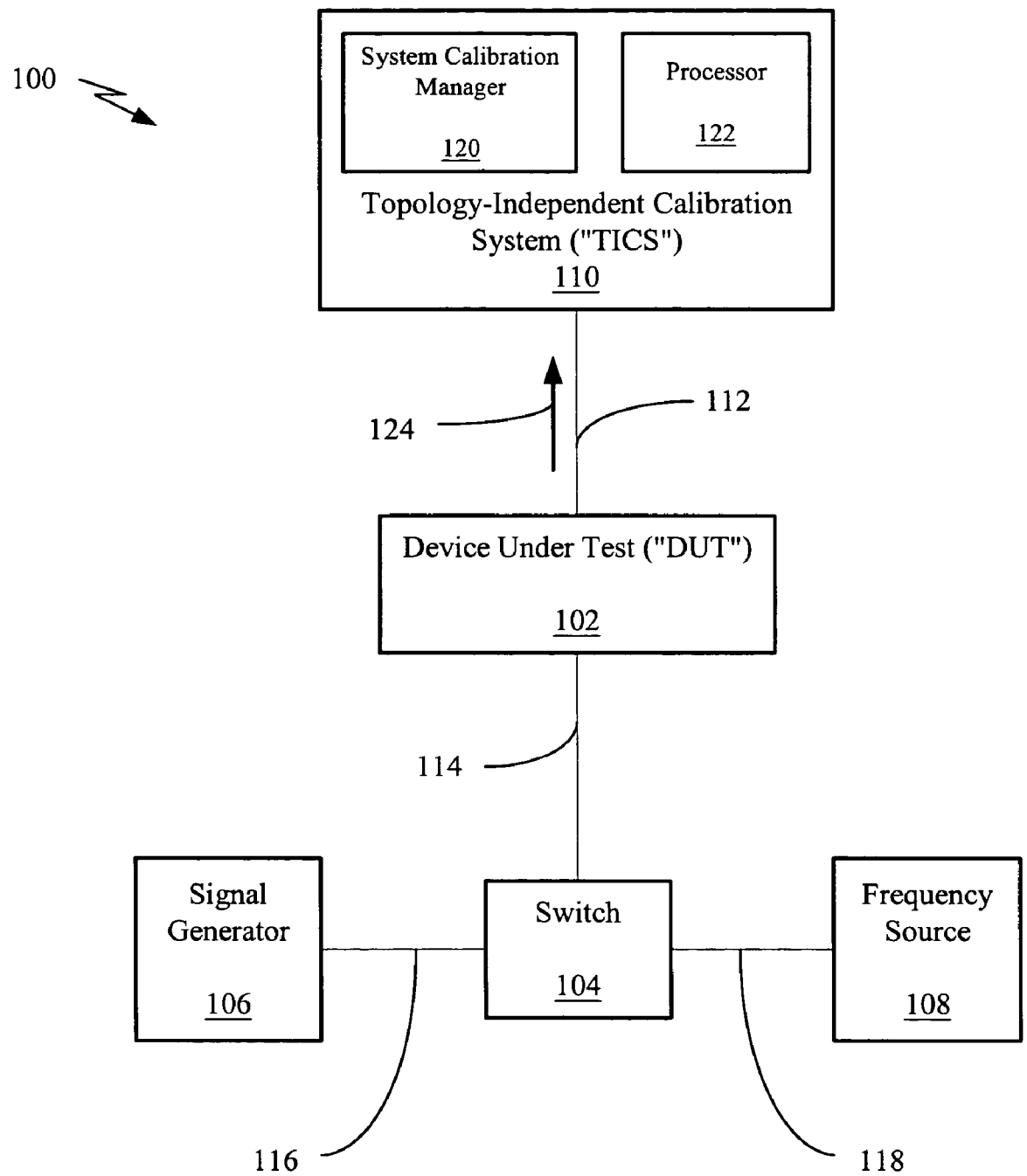
FIG. 1 is a block diagram an example of an implementation of a test system having a topology-independent calibration system ("TCIS").

In FIG. 1, a block diagram of an example of an implementation of a test system 100 is shown. The test system 100 may include test instruments such as a DUT 102, switch 104, signal generator 106, frequency source 108, and the TCIS 110. The DUT 102 may be in signal communication with the switch 104 and the TICS 110 via signal paths 112 and 114, respectively. The switch 104 may also be in signal communication with the signal generator 106 and the frequency source 110 via signal paths 116 and 118, respectively. The TICS 110 may include a system calibration manager 120 and a processor 122.

The processor 122 may be implemented by general purpose processor (such as central processing unit ("CPU") in a personal computer, microcomputer, or workstation), microprocessor, controller, microcontroller, digital signal processor ("DSP"), application specific integrated circuit ("ASIC"), or other similar programmable device. The processor 122 may be configured to run software and/or control the other sections of the TICS 110 and the test system 100 (if the test system 110 is configured in an automatic configuration).

As an example of an implementation, each signal path 112, 114, 116, and 118 may be a transmission line such as a cable, coaxial cable, waveguide, or fiber optic cable. It is appreciated by those skilled in the art that the type of transmission line utilized in the test system 100 is generally determined by the frequency of operation of the devices in the test system 100. Generally, each signal path and test instrument has an effect on the output 124 of the DUT 102 as measured by the TICS 110.

As an example, the test system 100 is shown in one of many possible configurations. Thus, it is appreciated that it is impractical for a single set of equations to cover all the possible path corrections in the test system 100. As the test system 100 is expanded with more test components, signal paths, and other additional elements or devices, additional possible signal paths are created. Since the test system 100 topology often cannot be determined in advance, the current implementation of the TICS 110 for determining path calculations utilizes a list or database of measured linear network parameters, such as S-parameters (or other linear model parameters) and a netlist (system topology), which enables a S-parameter simulator to de-embed path characteristics of the test system 100 from the measurement data. It is appreciated that S-parameters are reflection and transmission coefficients utilized in impedance matching between radio-frequency ("RF") devices and transmission lines. It is also appreciated that a netlist is a list (such as an electronic file) of parts/devices (such as logic gates, switches, signal path combiners) and their connection points that are connected in each net that make up an electronic circuit, i.e., a netlist file describes the interconnection information of the electronic circuit.

In other examples of implementations, a database (not shown) or data structure (not shown) may contain other types of parameters that characterize electrical systems other than S-parameters. In yet other examples of implementations, a database or data structure may include other types of parameters along with the S-parameters.

In general, a database of a library of parts may be generated that includes S-parameter characteristics of standard adapters and connectors. The library may include both preloaded information about the standard adapters and accepted (i.e., either inputted into or measured by the TICS 110) S-parameter measurements of other elements such as transmission lines and lab-made test jigs. Ideally, an S-parameter may be measured for a grouping of test components such as 104, 106, 108, 112, 114, 116, and 118 and the results stored in the library or database of S-parameters. A further end-to-end signal path loss measurement may be made using a test component, such as a power meter (not shown). In other examples of implementations, an error correction module (not shown) found in some test components, such as network analyzers, may access the S-parameter data and utilize it to correct measurement errors associated with that test component.

As an example of operation, when a test procedure is executed by the TICS 110 while measuring the DUT 102, a connection to the database (not shown) or stored S-parameter information is accessed by the TICS 110. The S-parameter information is associated in the TICS 110 with topology of the test system 100 and the desired measurement reference plane. It is appreciated that the test system 100 topology may be specified as a netlist in a mark-up language such as automatic test markup language "ATML"-compatible data file (i.e. extensible markup language "XML") or similar data format. In other examples of implementations, XML data file may be converted utilizing a converter from XML to a netlist.

A simulator (not shown) may be utilized as the basis for path measurement corrections to the measurement data and to obtain measurement uncertainty data. The uncertainty data of the test components 106, 108 and 110 would have to be stored in the database or library in order to obtain measurement uncertainty data. The determination of the measurement uncertainty data may then be obtained by utilizing a "Monte Carlo" analysis or other simulation techniques utilizing the values in the database or library that is associated with the netlist of test components.

An additional advantage of determining system calibration before and after the DUT 102 is tested by the TICS 110, is to identify any faults and changes in the test system 100. Undesired changes in the test system 100 may be the result of transmission line faults, hardware test equipment malfunctions, or even environment interference (i.e. temperature). By storing historical calibration data for the test system 100 over time, this approach enables operators to rapidly diagnose failures or even predict them.

In some situations, it may be assumed that the output power of a source/upconverter (such as the signal generator 106) has been calibrated (typically via an instrument calibration cycle). However, losses between the output of the signal generator 106 and the input of the DUT 102 are often high enough that the signal generator 106 output should be increased to compensate for the loss. As an example, if the test system 100 has been characterized and the topology is known, the S-parameter simulator may calculate the power that will be delivered to the input of the DUT 102. This enables the input power to be accurately determined (within the uncertainty of the signal generator 106) without the use of a power meter, even for broadband signals. However, for higher accuracy, a power meter may still be utilized.

As an example, an S-parameter simulator, such as the Touchstones® simulator (produced and owned by Agilent Technologies of Palo Alto, Calif.) may be utilized to process the S-parameters associated with the test system 100. The simulator may be implemented in hardware or software. The S-parameter simulator may be implemented as part of the system calibration manager 120. As an example, the system calibration manager 120 may integrate all the calibration functions of the TICS 110 together.

Figure 2:
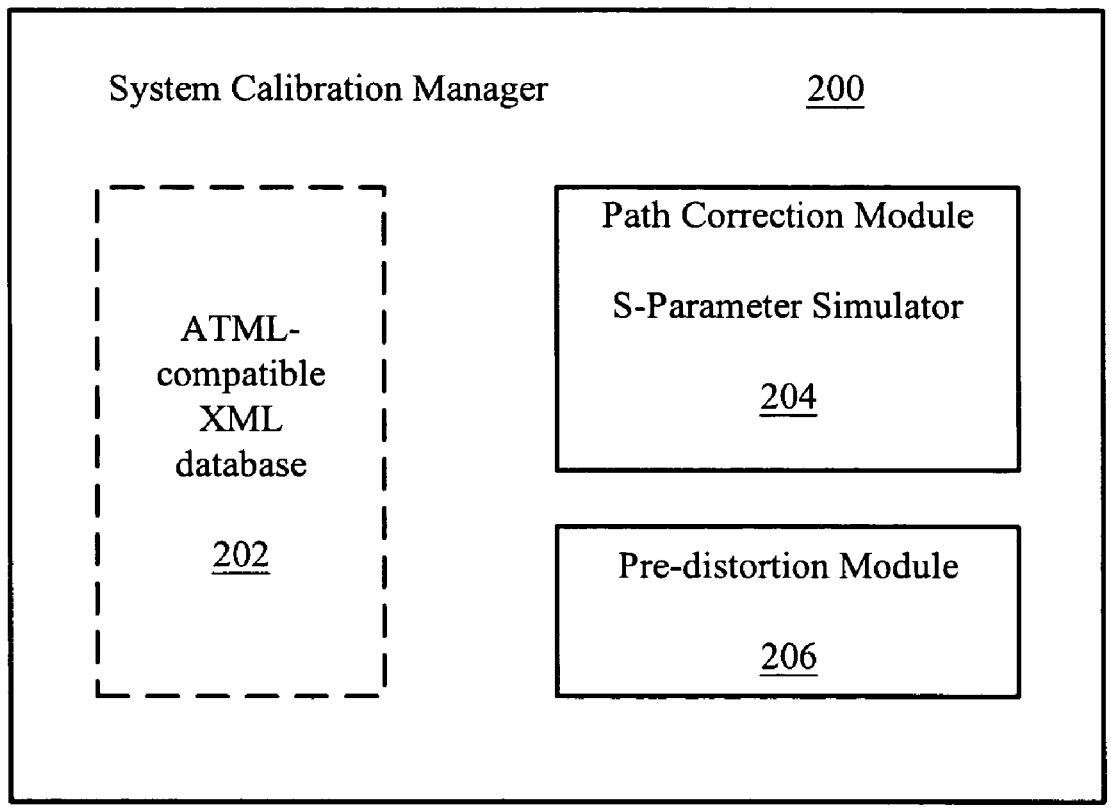
FIG. 2 is a block diagram of an example of an implementation of the system calibration manager within the TCIS shown in FIG. 1.

In FIG. 2, a block diagram of an example of an implementation of the system calibration manager 200 within the TCIS 110 of FIG. 1 is shown. The system calibration manager 200 may include a database 202 such as an ATML-compatible XML database, path correction module 204 such as an S-parameter simulator, and pre-distortion module 206. The ATML-compatible XML database 202 may be optionally located internal to the system calibration manager 200, as shown in FIG. 2, or external to the system calibration manager 200 within the TCIS 110 and in signal communication with the system calibration manager 200 via a data network protocol. In other implementations, the database 202 may be implemented as a combination of internal storage elements (not shown) and external storage elements (not shown). Further, the ATML-compatible XML database 202 may be implemented as a structured query language ("SQL") or other database with additional procession of the data being utilized to form a netlist.

As an example, the database 202 may include S-parameter data, other linear network parameter data, and various other types of data that are utilized for error correction calculations. In this implementation example, the database 202 utilizes ATML schemas, but it is appreciated by those skilled in the art that other types of schemas also may be utilized for S-parameter data with additional processing.

The path correction module 204 may be an S-parameter simulator employed to determine the signal path errors and in response, generate signal path corrections to compensate for the signal path errors. The path correction module 204 may be called or accessed by user test procedures directly, without the knowledge of the underlying simulator technology. Typically the test procedures would call the path correction module 204 at the start and end of test procedures executed on the test system 100, FIG. 1. Furthermore, the pre-distortion module 206 may perform pre-distortion calculations on a given waveform generated by the path correction module 204.

Figure 3:
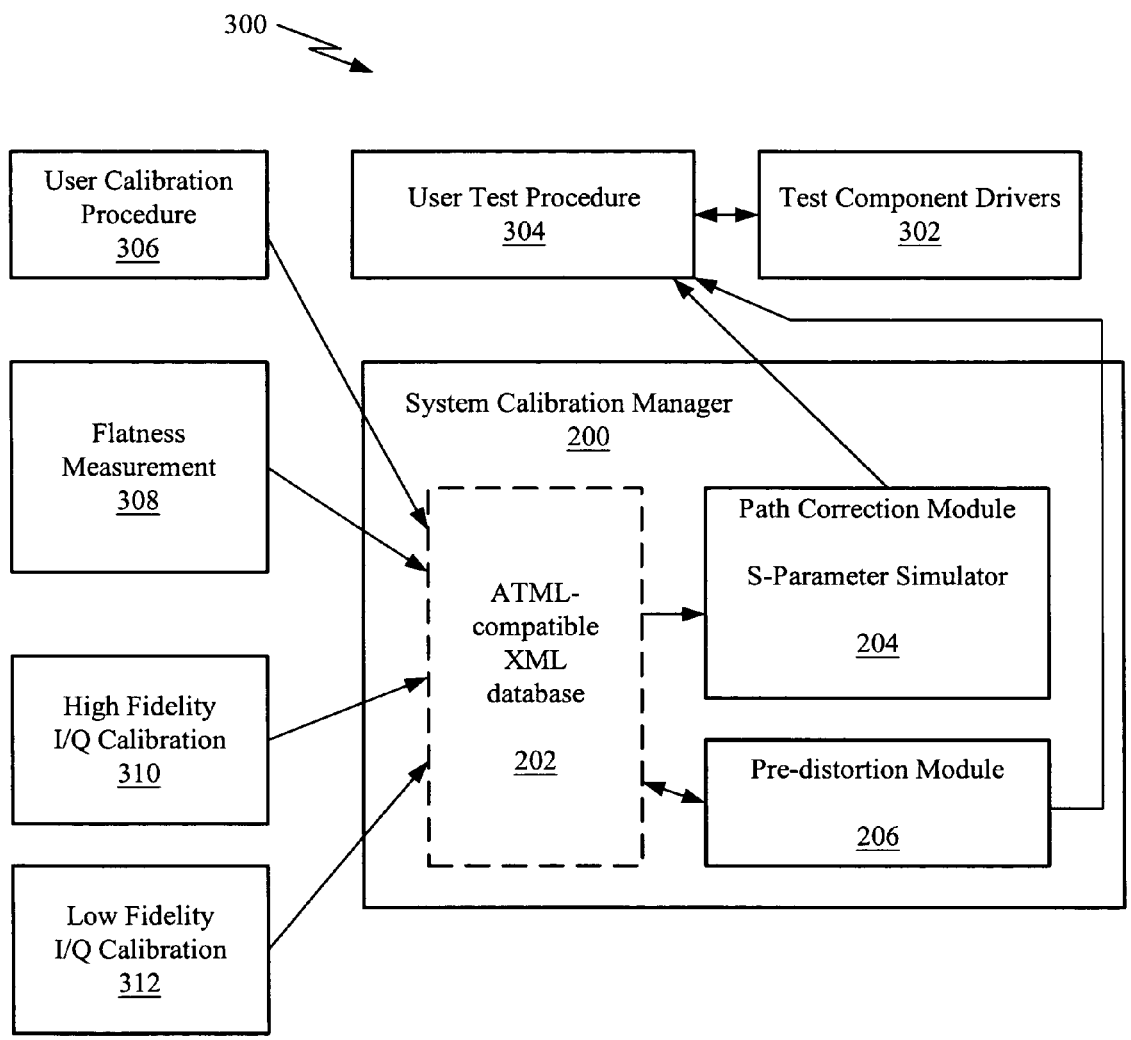
FIG. 3 is a block diagram of an example of an implementation of the system calibration manager interacting with a test environment for testing the test system shown in FIG. 1.

In FIG. 3, a block diagram 300 of the system calibration manager 200 interacting with a test environment for testing the test system 100 of FIG. 1 is shown. A plurality of test component drivers 302 provide an interface between the test components and a user test procedure 304. As an example, the user test procedure 304 may be a plurality of test instructions that when executed cause predetermined events to happen in the test system 100, FIG. 1, to test the DUT 102. The user test procedure 304 receives information from path corrections module 204, pre-distortion module 206 and the database 202 via the system calibration manager 200.

As an example of operation, a user calibration procedure 306 may be initiated to calibrate the test system 100. The user calibration procedure 306 may initiate a number of calibration measurements that may include, for example, a Flatness Measurement 308, High Fidelity I/Q Calibration 310, and low fidelity I/Q calibration 312, etc. The user calibration procedure 306 may then provide the results of the calibration measurements to the database 202. The path correction module 204 may then utilize that information and other information stored in the database 202.

Figure 4:
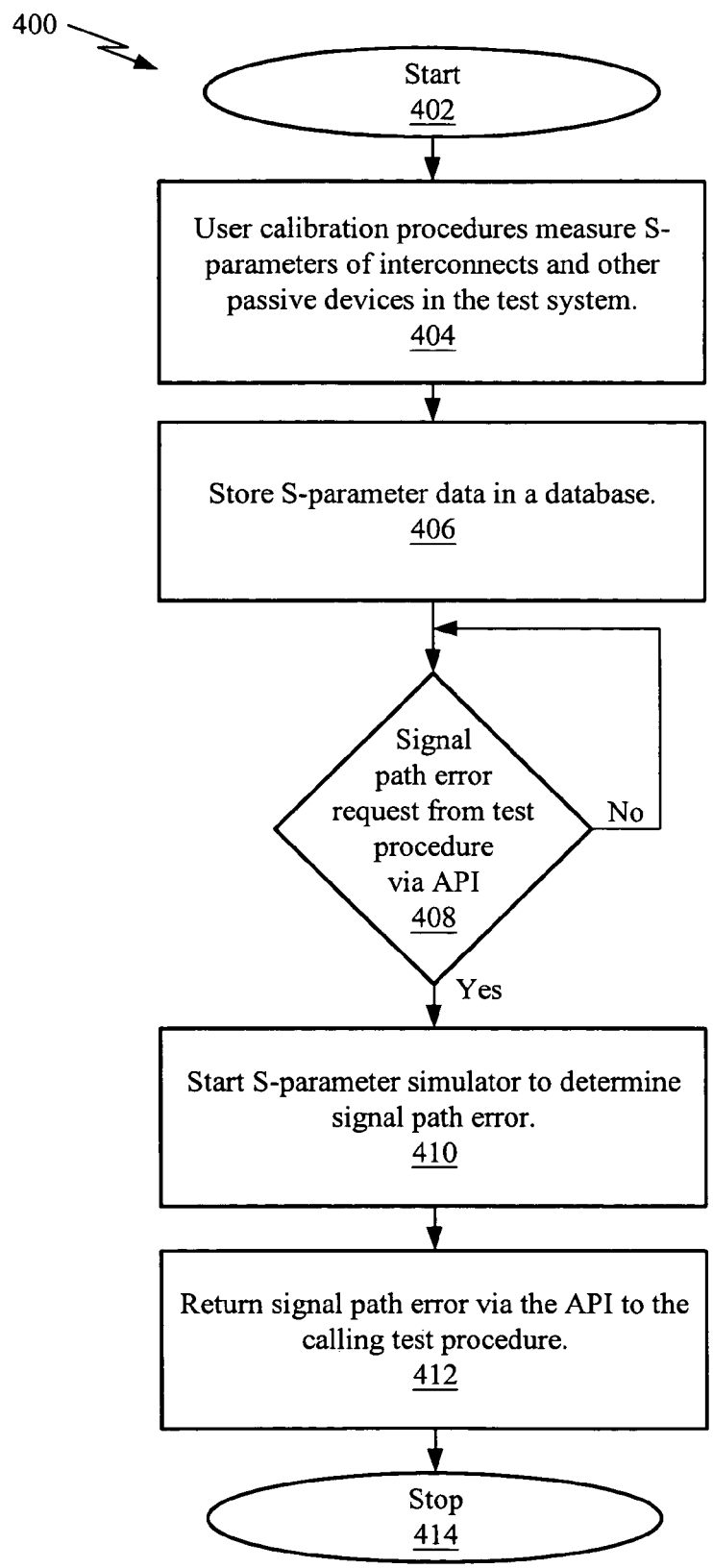
FIG. 4 is a flow diagram of an example of an implementation of a process to determine the path error of the test system shown in FIG. 1.

Turning to FIG. 4, a flow diagram 400 of an example of an implementation of a process to determine the path error of the test system 100 of FIG. 1 is shown. The flow diagram 400 may start in step 402 and then proceed with the user calibration procedures of the test components providing S-parameters for interconnects and other linear devices and even some non-linear devices (i.e. mixers) in the test system 100 in step 404. The S-parameters may be preloaded in test instruments or may be determined from a list or database of components. Some components may need to be individually tested or tested in groups to determine the S-parameters. The S-parameters are then stored in a list or database of S-parameters in step 406.

In step 408, a signal path error request from test procedure may be received via an application program interface. If not received, the step repeats. If, instead, the signal path error request is received, the path correction module 204 (such as S-parameter simulator) then determines the signal path error in step 410. The signal path error is then returned to the calling test procedure via the API in step 412 and processing ends in step 414. In other implementation examples, the test procedure may pass the measured data to the error correction module, and the error correction module may then return the corrected test results.

The flow diagram may be implemented in software or hardware or a combination of software and hardware. The software may be presented on a machine readable medium such as a tape, compact disc, paper punch cards, smart cards, or other optical, magnetic, or electrical digital storage device.

Additionally, persons skilled in the art will understand and appreciate, that one or more processes, sub-processes, or process steps described in connection with FIG. 4 may be performed by hardware and/or software. Additionally, the TICS 110 may be implemented completely in software that would be executed within a microprocessor, general purpose processor, combination of processors, digital signal processor ("DSP"), and/or application specific integrated circuit ("ASIC"). If the process is performed by software, the software may reside in software memory (not shown) in the TICS 110. The software in software memory may include an ordered listing of executable instructions for implementing logical functions (i.e., "logic" that may be implemented either in digital form such as digital circuitry or source code or in analog form such as analog circuitry or an analog source such an analog electrical, sound or video signal), and may selectively be embodied in any computer-readable, machine-readable, or signal-bearing medium for use by or in connection with an instruction execution system, apparatus, or device, such as a computer-based system, processor-containing system, or other system that may selectively fetch the instructions from the instruction execution system, apparatus, or device and execute the instructions. In the context of this document, a "computer-readable medium" and/or "signal-bearing medium" is any means that may contain, store, communicate, propagate, or transport the program for use by or in connection with the instruction execution system, apparatus, or device. The computer readable medium may selectively be, for example but not limited to, an electronic, magnetic, optical, electromagnetic, infrared, or semiconductor system, apparatus, device, or propagation medium. More specific examples, but nonetheless a non-exhaustive list, of computer-readable media would include the following: an electrical connection (electronic) having one or more wires; a portable computer diskette (magnetic); a RAM (electronic); a read-only memory "ROM" (electronic); an erasable programmable read-only memory (EPROM or Flash memory) (electronic); an optical fiber (optical); and a portable compact disc read-only memory "CDROM" (optical). Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

The foregoing description of an implementation has been presented for purposes of illustration and description. It is not exhaustive and does not limit the claimed inventions to the precise form disclosed. Modifications and variations are possible in light of the above description or may be acquired from practicing the invention. For example, the described implementation includes software but the invention may be implemented as a combination of hardware and software or in hardware alone. Note also that the implementation may vary between systems. The claims and their equivalents define the scope of the invention.

What is claimed is:

1. A calibration system that is independent of a particular topology within a test system having a plurality of components that are connected to one another, comprising:
   a netlist, wherein the netlist includes a list of the components contained within the test system and interconnections between the components of the test system;
   a path correction module; and
   a processor in signal communication with the path correction module, wherein the processor utilizes the path correction module and the netlist to determine path calibration parameters for correcting measurements made on a device under test with the test system for the effects of the components.

2. The calibration system of claim 1, wherein the path correction module is an S-parameter simulator.

3. The calibration system of claim 2, wherein the netlist includes:
electrical characteristics of a first component;
electrical characteristics of an at least second component; and
an S-parameter associated with both the first component and the at least second component.

4. The calibration system of claim 1, wherein the netlist includes a database of S-parameters that characterize the components.

5. The calibration system of claim 4, wherein a schema associated with the database is a markup language schema.

6. The calibration system of claim 1, further including:
an application program interface in signal communication with the calibration system; and
an at least one test procedure initiating execution of the path correction module.

7. The calibration system of claim 1, further including an input power calculation value determined by the processor via the execution of the path correction module.

8. A method for determining path calibration parameters for correcting measurements of a device under test for the effects of components from which a test system is constructed, the method comprising:
executing a path correction module by a processor;
accessing a netlist containing list of the components contained within the test system and the interconnections of the components; and
determining a path calibration parameters for correcting measurements made on a device under test with the test system for the effects of the components.

9. The method of claim 8, wherein executing the path correction module includes executing an S-parameter simulator.

10. The method of claim 9, where accessing the netlist includes accessing a database of S-parameters that characterize the components of the test system.

11. The method of claim 10, where a schema associated with the database is a markup language schema.

12. The method of claim 10, further including:
executing a test procedure; and
utilizing the path correction module in response to receipt of an instruction via an application program interface from the test procedure.

13. The method of claim 10, further including storing an S-parameter in the database wherein the S-parameter is associated with both a first component and at least a second component.

* * * * *